United States Patent
Niu

(10) Patent No.: US 10,153,733 B2
(45) Date of Patent: Dec. 11, 2018

(54) ACTIVE BIAS CIRCUIT FOR POWER AMPLIFIER, AND MOBILE TERMINAL

(71) Applicant: SHANGHAI VANCHIP TECHNOLOGIES CO., LTD., Shanghai (CN)

(72) Inventor: Xu Niu, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 15/551,042

(22) PCT Filed: Jan. 12, 2016

(86) PCT No.: PCT/CN2016/070729
§ 371 (c)(1),
(2) Date: Aug. 15, 2017

(87) PCT Pub. No.: WO2016/127752
PCT Pub. Date: Aug. 18, 2016

(65) Prior Publication Data
US 2018/0034414 A1 Feb. 1, 2018

(30) Foreign Application Priority Data

Feb. 15, 2015 (CN) .......................... 2015 1 0081837

(51) Int. Cl.
| | |
|---|---|
| *H03F 1/30* | (2006.01) |
| *H03F 1/02* | (2006.01) |
| *H03F 1/56* | (2006.01) |
| *H03F 3/19* | (2006.01) |
| *H03F 3/21* | (2006.01) |
| *H03F 3/24* | (2006.01) |

(52) U.S. Cl.
CPC .......... *H03F 1/0205* (2013.01); *H03F 1/302* (2013.01); *H03F 1/56* (2013.01); *H03F 3/19* (2013.01);
(Continued)

(58) Field of Classification Search
CPC ....................................................... H03F 1/30
(Continued)

(56) References Cited

U.S. PATENT DOCUMENTS

| | | | |
|---|---|---|---|
| 6,078,208 A * | 6/2000 | Nolan ...................... | G01K 7/01 327/512 |
| 6,400,207 B1 * | 6/2002 | Ivanov .................... | G05F 3/262 323/901 |

(Continued)

FOREIGN PATENT DOCUMENTS

| | | |
|---|---|---|
| CN | 1330458 A | 1/2002 |
| CN | 101405934 A | 4/2009 |

(Continued)

*Primary Examiner* — Henry Choe
(74) *Attorney, Agent, or Firm* — Mark M. Friedman

(57) ABSTRACT

An active bias circuit for a power amplifier and a mobile terminal are disclosed. The circuit includes a proportional to absolute temperature (PTAT) current source circuit, a reference voltage circuit, an isolation voltage stabilizing circuit, and a bias voltage circuit. An input end of the PTAT current source circuit is connected to a voltage source (Vbat), and an output end is connected to the reference voltage circuit. The reference voltage circuit generates a reference voltage that is in proportion to a current and a temperature. The isolation voltage stabilizing circuit isolates the reference voltage circuit from the bias voltage circuit, and supplies a stabilized voltage to the bias voltage circuit by using a negative feedback loop. The bias voltage circuit receives the voltage of the isolation voltage stabilizing circuit, and is also connected to the voltage source (Vbat).

9 Claims, 4 Drawing Sheets

(52) U.S. Cl.
CPC ............... *H03F 3/21* (2013.01); *H03F 3/245* (2013.01); *H03F 2200/111* (2013.01); *H03F 2200/222* (2013.01); *H03F 2200/318* (2013.01); *H03F 2200/387* (2013.01); *H03F 2200/408* (2013.01); *H03F 2200/411* (2013.01); *H03F 2200/451* (2013.01)

(58) Field of Classification Search
USPC ........................................ 330/289, 296, 285
See application file for complete search history.

(56) References Cited

U.S. PATENT DOCUMENTS

| | | | |
|---|---|---|---|
| 6,677,808 B1 * | 1/2004 | Sean | ........................... G05F 3/30 323/313 |
| 7,729,672 B2 | 6/2010 | Deng et al. | |
| 8,183,928 B2 * | 5/2012 | Kim | ........................... H03F 1/30 330/285 |
| 8,358,119 B2 * | 1/2013 | Kim | ........................ G05F 3/242 323/313 |
| 8,766,611 B2 * | 7/2014 | Hu | ........................... G05F 1/561 323/281 |
| 8,981,849 B2 | 3/2015 | Song | |
| 2013/0034482 A1 | 2/2013 | Zones et al. | |

FOREIGN PATENT DOCUMENTS

| | | |
|---|---|---|
| CN | 201368997 Y | 12/2009 |
| CN | 201409116 Y | 2/2010 |
| CN | 102255605 A | 11/2011 |
| CN | 103872994 A | 6/2014 |
| CN | 104682898 A | 6/2015 |

* cited by examiner

ACTIVE BIAS CIRCUIT FOR POWER AMPLIFIER, AND MOBILE TERMINAL

BACKGROUND

Technical Field

The present invention relates to the field of power amplifier technologies, and in particular, to an active bias circuit for a power amplifier and a mobile terminal including the active bias circuit.

Related Art

As well known, to implement high-speed data transmission, 3G communications systems including WCDMA/TD-SCDMA and 4G communications systems including TD-LTE/LTE-FDD have much higher requirements on linearity of signals output by a power amplifier than communications modes such as GSM850/EDGE900/DCS 1800/PCS 1900. Therefore, the power amplifier is required to have a relatively high linear output power. It can be seen from FIG. 1 that duplexers and filters inevitably cause a signal loss, significantly increasing difficulty in maintaining high linearity of the power amplifier.

In the power amplifier, a bias circuit is responsible for providing a proper and stabilized bias state for a power-amplifier tube, and is important for maintaining linearity of the power amplifier. However, a bias circuit of a power amplifier in an existing GSM/EDGE/GPRS standard cannot be applicable to all currently mainstream 3G/4G mobile phones. A 3G/4G communications standard requires the power amplifier to have a higher power output. However, in a high power output state, a temperature of a chip of the power amplifier gradually rises (mainly a junction temperature of the power-amplifier tube rises). For the bias circuit, two conditions need to be met to keep the power-amplifier tube in a stabilized bias state as much as possible. First, the temperature of the chip is controllable, to avoid out of control or even burning of the chip resulting from a steady temperature increase and a current increase. Second, the power-amplifier tube is kept working in a relatively stabilized state by using a feedback mechanism, to suppress bias state shifting and linearity deterioration caused by temperature shifting.

Currently, some bias circuit structures meeting the foregoing conditions have been proposed in the industry and academia, but many bias circuit structures are insufficient to some extent in production and use, for example, increase process difficulty, cause a loss in power gains and efficiency, and increase a chip area and costs. For example, Chinese patent No. ZL 200780009732.5 discloses a dynamic bias control circuit for a power amplifier. However, the power amplifier is a design solution wasting a chip area. Correspondingly, a bias circuit structure introduced into the patent is relatively complex, and is inapplicable to chips of power amplifiers of 3G/4G mobile phones. For another example, Chinese patent No. ZL 01122022.8 discloses an active bias network circuit for a radio frequency amplifier. However, a bias circuit of a power amplifier in the patent has a complex structure, and a power amplifier module is required to include one independent bias circuit chip based on a complementary metal-oxide-semiconductor (CMOS) technology, increasing design implementation difficulty and costs of a chip of the radio frequency power amplifier.

It can be learned from the foregoing that bias circuits of current power amplifiers actually applicable to mobile communication still fail to meet requirements in practice.

SUMMARY

For disadvantages in the prior art, a key technical problem to be resolved in the present invention is to provide an active bias circuit for a power amplifier that is based on an existing chip production process.

Another technical problem to be resolved in the present invention is to provide a mobile terminal including the foregoing active bias circuit.

To achieve the foregoing invention objectives, the present invention is implemented by means of the following technical solutions:

According to a first aspect of embodiments of the present invention, an active bias circuit for a power amplifier is provided, including a proportional to absolute temperature (PTAT) current source circuit, a reference voltage circuit, an isolation voltage stabilizing circuit, and a bias voltage circuit, where an input end of the PTAT current source circuit is connected to a voltage source, and an output end is connected to the reference voltage circuit, to generate a current that is in proportion to the voltage source and a temperature;

the reference voltage circuit generates a reference voltage that is in proportion to the current and the temperature;

the isolation voltage stabilizing circuit isolates the reference voltage circuit from the bias voltage circuit, and supplies a stabilized voltage to the bias voltage circuit by using a negative feedback loop; and the bias voltage circuit receives the voltage of the isolation voltage stabilizing circuit, and is also connected to the voltage source, to generate a bias voltage of a power-amplifier tube.

Preferably, the PTAT current source circuit includes two groups of current mirror circuits, multiple triodes, and a resistor, where a first group of current mirror circuit includes three P-type metal-oxide-semiconductor (PMOS) transistors; sources of the three PMOS transistors are connected to the voltage source, and gates of the PMOS transistors interconnect with each other; a drain of a first PMOS transistor is connected to a drain of a first N-type metal-oxide-semiconductor (NMOS) transistor; a drain of a second PMOS transistor is connected to a drain of a second NMOS transistor, and a drain of a third PMOS transistor is connected to the reference voltage circuit;

a second group of current mirror circuit includes the first NMOS transistor and the second NMOS transistor; a gate of the first NMOS transistor is connected to the drain of the first NMOS transistor and a gate of the second NMOS transistor, and a source is connected to a first triode; and a source of the second NMOS transistor is connected to a first resistor;

the first triode and a second triode are serially connected to the ground; and the first resistor, a third triode, and a fourth triode are serially connected to the ground.

Preferably, emission junction areas of the first triode and the second triode are equal, emission junction areas of the third triode and the fourth triode are equal, and an emission junction area of the first triode needs to be greater than an emission junction area of the third triode.

Preferably, the reference voltage circuit includes triodes and one resistor, where one end of a second resistor is separately connected to the PTAT current source circuit and the isolation voltage stabilizing circuit; and the other end of the second resistor is connected to a collector and a base of a fifth triode; an emitter of the fifth triode is connected to a collector and a base of a sixth triode; and an emitter of the sixth triode is grounded.

Preferably, the isolation voltage stabilizing circuit includes resistors and triodes, where a collector of a seventh triode is connected to an output end of the reference voltage circuit and one end of a third resistor, a base is connected to the other end of the third resistor and a collector of an eighth triode, and an emitter is connected to a fourth resistor and a base of the eighth triode;

an emitter of the eighth triode and the other end of the fourth resistor are both grounded; and a point that connects the seventh triode, the third resistor, and the eighth triode is connected to the bias voltage circuit.

Preferably, the emitter of the eighth triode is grounded by using a resistor.

Preferably, the bias voltage circuit is a triode, where a collector of a ninth triode is connected to the voltage source, a base receives the voltage supplied by the isolation voltage stabilizing circuit, and an emitter is connected to a base of the power-amplifier tube.

Preferably, the bias voltage circuit further includes multiple diodes that are connected in parallel, where an anode of each diode is grounded, and a cathode is connected to the collector of the ninth triode.

Preferably, the active bias circuit further includes a self-heating compensation circuit; and the self-heating compensation circuit includes a triode and a resistor, a base of a tenth triode is connected to a base of the power-amplifier tube, a collector is grounded by using a fifth resistor, and an emitter is connected to a collector of the power-amplifier tube.

According to a second aspect of the embodiments of the present invention, a mobile terminal is provided, where a power amplifier thereof uses the foregoing active bias circuit.

The active bias circuit provided in the present invention can be implemented based on an existing chip production process, can suppress to some extent bias state shifting caused by temperature shifting, to provide a stabilized bias state for a power-amplifier tube, and can also overcome, by introducing a compensation mechanism, linearity deterioration caused by an increase in a temperature in a high power output state, thereby effectively improving linearity of a power amplifier.

DETAILED DESCRIPTION

The following describes technical content of the present invention in detail with reference to the accompanying drawings and specific embodiments.

Figure 1:
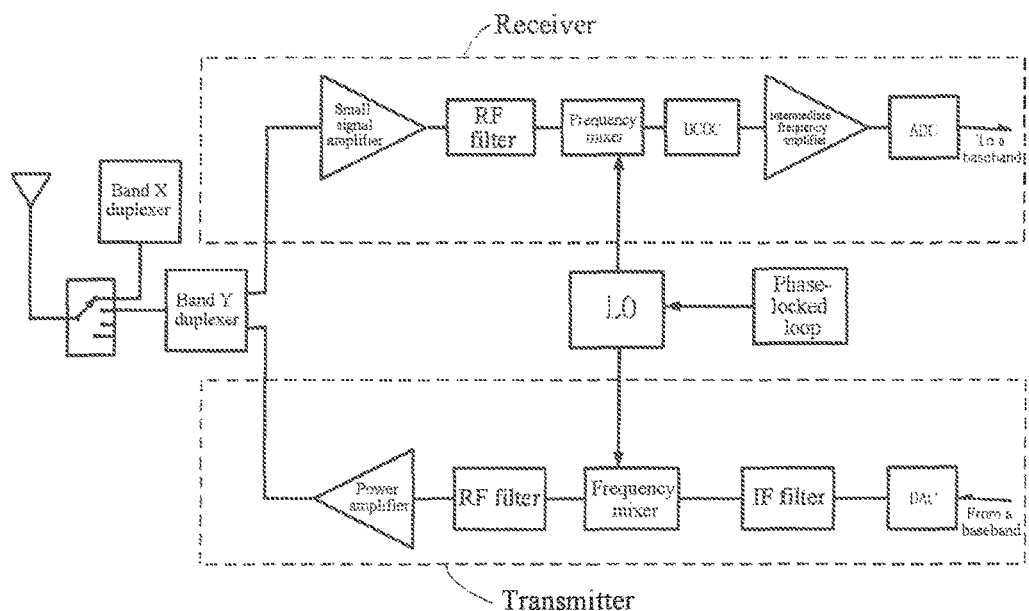
FIG. 1 is a structural block diagram of a zero intermediate frequency (Zero-IF) radio frequency transceiver.
Figure 2:
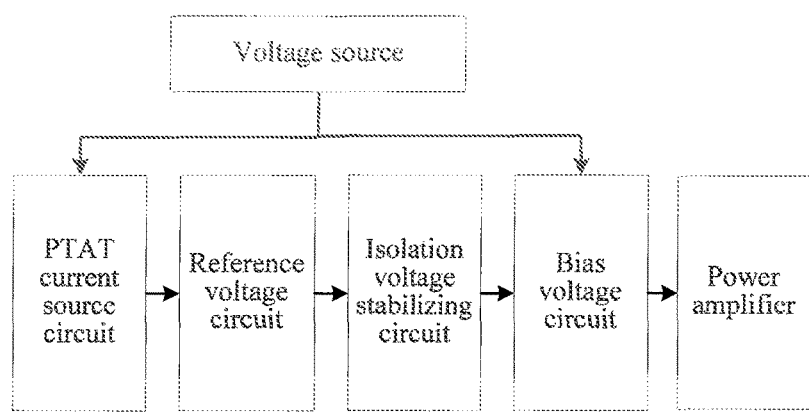
FIG. 2 is a block diagram of a principle of an active bias circuit provided in the present invention.

Referring to FIG. 2, an active bias circuit provided in the present invention includes a PTAT current source circuit 10, a reference voltage circuit 20, an isolation voltage stabilizing circuit 30, and a bias voltage circuit 40. An input end of the PTAT current source circuit 10 is connected to a voltage source, and an output end is connected to the reference voltage circuit 20, to generate a current that is in proportion to the voltage source and a temperature. The reference voltage circuit 20 generates a voltage that is in proportion to the current and the temperature. The isolation voltage stabilizing circuit 30 isolates the reference voltage circuit 20 from the bias voltage circuit 40, and supplies a stabilized voltage to the bias voltage circuit 40 by using a negative feedback loop. The bias voltage circuit 40 receives the voltage of the isolation voltage stabilizing circuit 30, and is also connected to the voltage source, to generate a bias voltage needed by a power amplifier. It should be noted that, a power amplifier stage is not limited in this active bias circuit, for example, a single-stage power amplifier including one-stage power-amplifier tube, or a multistage power amplifier including a three-stage power-amplifier tube. The following describes an embodiment of a two-stage power amplifier including two power-amplifier tubes.

Figure 3:
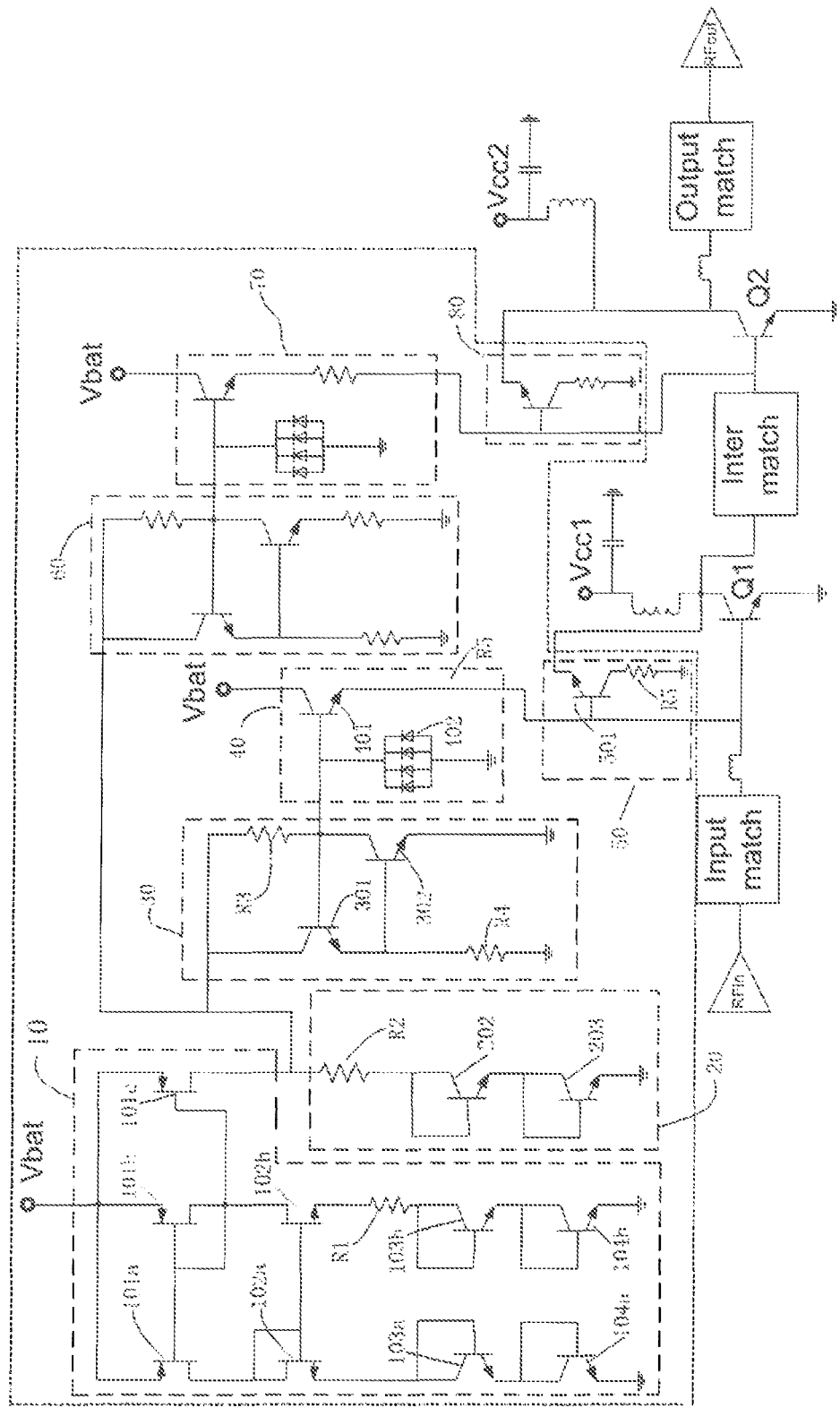
FIG. 3 is a schematic structural diagram of a circuit in a first embodiment of the present invention.

Referring to FIG. 3, the power amplifier includes: two power-amplifier tubes Q1 and Q2, an input matching network, an input bond wire, an inductor of the power-amplifier tube Q1, an inter-stage matching network, an inductor of the power-amplifier tube Q2, an output bond wire, an output matching network, and corresponding bias circuits of the power-amplifier tubes Q1 and Q2. Each bias circuit includes the PTAT current source circuit 10, the reference voltage circuit 20, the isolation voltage stabilizing circuit 30, the bias voltage circuit 40, and a self-heating compensation circuit 50. The PTAT current source circuit 10 and the reference voltage circuit 20 may be shared by the two power-amplifier tubes, but the isolation voltage stabilizing circuit 30, the bias voltage circuit 40, and the self-heating compensation circuit 50 need to be separately configured for each power-amplifier tube. Each power-amplifier tube has a different design requirement; therefore, parameters, a quantity, and the like of elements in the isolation voltage stabilizing circuit 30, the bias voltage circuit 40, and the self-heating compensation circuit 50 are adaptively adjusted according to an actual requirement.

In an embodiment of the present invention, the PTAT current source circuit 10 is used to generate a PTAT current that is in proportion to the voltage source and an environmental temperature, and includes two groups of current mirror circuits and multiple triodes and a resistor. A first group of current mirror circuit includes three PMOS transistors (101a, 101b, 101c). The PMOS transistors 101a and 101b are a pair of mirrored current sources, and the PMOS transistors 101b and 101c are also a pair of mirrored current sources. Sources of the three PMOS transistors are connected to the voltage source of a mobile terminal, and gates of the three PMOS transistors are connected to each other. Drains of the PMOS transistors 101a and 101b are respectively connected to a pair of mirrored current sources in the second group of current mirror circuit. A drain of the PMOS transistor 101c acts as an output end of the PTAT current source circuit 10, and is connected to the reference voltage circuit 20. A second group of current mirror circuit includes two NMOS transistors 102a and 102b. Gates of the NMOS transistors 102a and 102b are connected to each other, and are also respectively connected to drains of the PMOS transistor 101a and the NMOS transistor 102a. The drain of the NMOS transistor 102b is connected to the drain of the PMOS transistor 101b. A source of the NMOS transistor 102 is grounded by using a path that serially connects two NPN heterojunction bipolar transistors (103a, 104a). Bases of the two transistors 103a and 104a are connected to respective collectors, and an emitter of the transistor 103b is connected to a collector of the transistor 104a. The emitter of the transistor 104b is grounded. A source of the NMOS transistor 102b is grounded by using a path that serially connects a resistor R1 and two NPN heterojunction bipolar transistors 103b and 104b. Bases of the two transistors 103b and 104b are connected to respective collectors, and an emitter of the transistor 103b is connected to a collector of the transistor 104b. The emitter of the transistor 104b is grounded.

The reference voltage circuit 20 generates, according to the PTAT current of the PTAT current source circuit 10, a reference voltage Vref that is in proportion to the PTAT current and the temperature. To keep Vref basically matching electric potentials at corresponding nodes of the isolation voltage stabilizing circuit 30 and a Vbias voltage generation circuit, the reference voltage Vref is generated by using a BE junction between NPN heterojunction bipolar transistors 202 and 203.

In an embodiment of the present invention, the reference voltage circuit 20 includes transistors 202 and 203 and a resistor R2. One end of the resistor R2 is connected to the PTAT current source circuit 10 and the isolation voltage stabilizing circuit 30, and the other end is connected to a collector and a base of the transistor 202. An emitter of the transistor 202 is connected to a collector and a base of the transistor 203, and an emitter of the transistor 203 is grounded. The following describes generation of the reference voltage Vref with reference to a specific calculation process.

In an embodiment of the present invention, emission junction areas of the transistors 103a and 104a in the PTAT current source circuit 10 need to be equal, and are set to S1. Emission junction areas of the transistors 103b and 104b need to be equal, and are set to S2. S1 and S2 need to satisfy S1>S2.

Assuming that a sum of BE junction voltages of the transistors 103a and 104a is $V_{BE1}$, it may be obtained that $V_{BE1}=V_{BE103a}+V_{BE104a}$ Likewise, a sum of BE junction voltages of the transistors 103b and 104b is $V_{BE2}$, and it may be obtained that $V_{BE2}=V_{BE103b}+V_{BE104b}$ BE junction voltages $V_{BE1}$ and $V_{BE2}$ and a voltage $V_{R1}$ of the resistor R1 have the following relationship, that is:

$\Delta V_{BE}=V_{R1}=V_{BE1}-V_{BE2}$

As can be known from a definition of a bandgap reference source and a temperature characteristic of an NPN transistor, there is a positive temperature coefficient, that is:

$$\frac{\partial \Delta V_{BE}}{\partial T} > 0$$

To obtain a reference voltage Vref with a zero temperature coefficient, the reference voltage circuit 20 need to include a composition part with a negative temperature coefficient, and the NPN transistor exactly has such a characteristic, that is:

$$\frac{\partial V_{BE}}{\partial T} < 0$$

Therefore, $\Delta V_{BE}$ and $V_{BE}$ may be properly weighted, to obtain the reference voltage Vref with a zero temperature coefficient. In an embodiment of the present invention, the reference voltage Vref with a zero temperature coefficient may be obtained by selecting proper resistance values R1 and R2:

$$V_{ref} = \frac{R2*(V_{BE1}-V_{BE2})}{R1} + V_{BE202} + V_{BE203}$$

In an embodiment of the present invention, the isolation voltage stabilizing circuit 30 is used to effectively isolate the reference voltage circuit 20 from the bias voltage circuit 40, to avoid the reference voltage circuit 20 from interference in a load change, and further ensure stability of an output voltage by using the negative feedback loop. In FIG. 3, the isolation voltage stabilizing circuit 30 of a first-stage power-amplifier tube includes two NPN heterojunction bipolar transistors 301 and 302 and two resistors R3 and R4. The resistor R3 and a collector of the transistor 301 are both connected to an output end of the reference voltage circuit 20. The other end of the resistor R3 acts as an output of the isolation voltage stabilizing circuit 30, and is further connected to both a base of the transistor 301 and a collector of the transistor 302. An emitter of the transistor 301 is connected to a base of the transistor 302 on one aspect, and is grounded by using the resistor R4 on another aspect. An emitter of the transistor 302 is directly grounded. A transistor in a second-stage isolation voltage stabilizing circuit is grounded by using a resistor. Specifically, element disposition needs to be determined according to an actual requirement. The following describes a voltage stabilizing principle of the isolation voltage stabilizing circuit 30 in detail.

As an output power increases or decreases, a temperature of a chip of the power amplifier rises or drops. This case is shown in the bias circuit as a rise or a drop of an output voltage Vb of the isolation voltage stabilizing circuit 30. To describe a negative feedback principle of the isolation voltage stabilizing circuit 30, it is assumed herein that Vb rises due to a temperature change of a working environment, that is:

$\Delta V_b > 0$

That is, a BE junction electric potential $V_{BE301}$ of the transistor 301 and a current $I_{CC301}$ of the collector rise, that is:

$\Delta V_{BE301} > 0$, and $\Delta I_{CC301} > 0$

Therefore, a voltage drop $\Delta V_{R4}$ of the resistor R4 rises, that is:

$\Delta V_{R4} = \Delta I_{CC301}*R4 > 0$

Therefore, a BE junction voltage of the transistor 302 rises, a current of the collector of the transistor 302 rises, and a voltage drop of the resistor R3 rises:

$\Delta V_{BE302} > 0$ $\Delta I_{CC302} > 0$ $\Delta V_{R3} = \Delta I_{CC302}*R3 > 0$ A rise of the voltage drop of the resistor R3 is bound to result in a drop of the electric potential Vb.

$\Delta V_b < 0$

By means of a feedback branch circuit of the resistor R3, Vb changes in contrary to an original tendency, so that the output voltage Vb gradually tends to be stabilized.

Conversely, a Vb change in a contrary tendency is gradually adjusted by using the negative feedback loop and then Vb tends to be stabilized. Details are not described herein. In conclusion, by means of the negative feedback loop introduced into the isolation voltage stabilizing circuit 30, the electric potential Vb may be kept in a stabilized state, to effectively isolate the reference voltage circuit 20 from a load.

In an embodiment of the present invention, the bias voltage circuit 40 is connected to both an output end of the isolation voltage stabilizing circuit 30 and a device voltage source Vbat, and is used to generate a voltage Vbias for biasing the power-amplifier tube Q1. The bias voltage circuit 40 in this embodiment may bias a voltage. Moreover, a compensation mechanism is introduced, and a power-amplifier tube is kept in a relatively stabilized bias state by means of a compensation effect. As shown in FIG. 3, the bias voltage circuit 40 of the first-stage power-amplifier tube includes an NPN heterojunction bipolar transistor 401 and a PN junction diode 402. A base of the transistor 401 is connected to the output end of the isolation voltage stabilizing circuit 30, and a cathode and a collector of the diode 402 are connected to a device voltage source Vbat. An emitter acts as an output end, and is directly connected to a base of the power-amplifier tube Q1. In this embodiment, in the bias voltage circuit 40 of the second-stage power-amplifier tube, an emitter of a transistor 401 is connected to a base of the power-amplifier tube Q2 by using a resistor, and an anode of a diode 402 is grounded. In this embodiment, a path that connects multiple diodes in parallel is used. Herein, a quantity of used diodes is not specifically limited.

Figure 4:
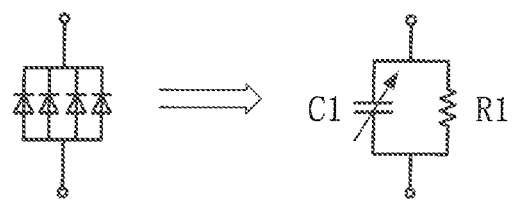
FIG. 4 is an equivalent circuit diagram of a diode of a bias voltage circuit in FIG. 3.
Figure 5:
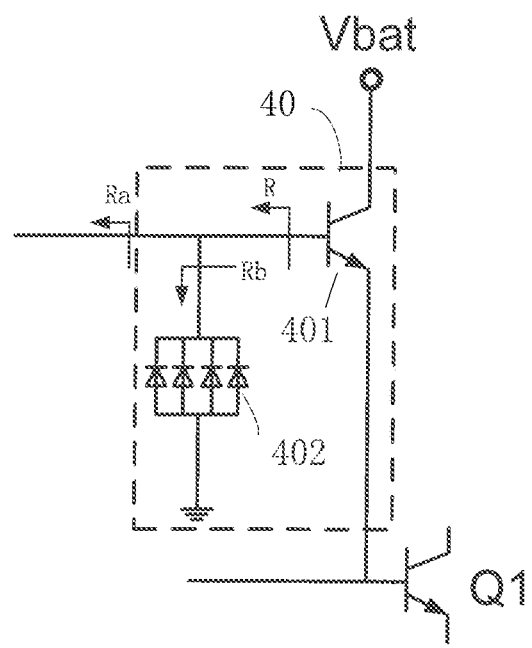
FIG. 5 is a circuit diagram of a bias voltage circuit in the present invention.

The following describes a compensation mechanism of the bias voltage circuit 40. When the temperature rises, a BE junction turn-on voltage of the power-amplifier tube Q1 reduces. Consequently, a bias current rises. A specific function of the triode 401 and a path that connects diodes 402 in parallel is enabling, by performing compensation, a BE junction voltage to drop at the same time when the BE junction turn-on voltage of the power-amplifier tube Q1 drops, so that the power-amplifier tube Q1 may be kept in a stabilized bias state. FIG. 4 is an equivalent circuit diagram of the diode 402 in FIG. 3. An inversely connected diode 402 may be equivalent to a network on which a variable capacitor C1 and the resistor R1 are connected in parallel. As shown in FIG. 5, the presence of the capacitor C1 and R1 enables a characteristic impedance R of a circuit part on the left of a base of the transistor 401 to reduce on a radio frequency, that is:

$$\frac{1}{R} = \frac{1}{R_a} + \frac{1}{R_b} = \frac{1}{R_a} + \omega c_1 + \frac{1}{R_0}$$

At a radio frequency power point, a reduction of the characteristic impedance value R causes a leakage of the radio frequency power into the ground through the diode 402. The leaked power generates a compensated current at the BE junction of the transistor 401. As the power increases, the power leaked to the ground through the diode 402 increases. The temperature of the chip rises, and the turn-on voltage of the power-amplifier tube Q1 drops. In this case, the compensated current steadily rises, a bias voltage of the transistor 401 at the BE junction drops, and a current through the collector does not continue to increase to burn the tube, so that the power-amplifier tube Q1 is kept in a relatively stabilized bias state.

In an embodiment of the present invention, a self-heating compensation circuit 50 is further added to the bias circuit. The circuit may automatically compensate gains for the radio frequency power-amplifier tube Q1 according to an internal temperature of the chip. Up to now, in methods proposed in the industry for overcoming a self-heating effect of a chip, some are excessively dependent on a new process to reduce heat resistance, and some may cause a power loss or a dramatic increase in a chip area. However, the self-heating compensation circuit 50 in this embodiment occupies very small chip area, and can be implemented by using a common process. For details, refer to FIG. 3. The self-heating compensation circuit 50 includes an NPN heterojunction bipolar transistor 501 and a resistor R5. A base of the transistor 501 is connected to both the output end of the reference voltage circuit 20 and the base of the power-amplifier tube Q1, an emitter is connected to a collector of the power-amplifier tube Q1, and a collector is grounded by using the resistor R5. The transistor 501 in the compensation circuit 50 acts as a switch of a compensation path, and by selecting a resistor R5 of a proper size, a turn-on time of the switch may be controlled and an amount of compensation may be determined.

Figure 6:
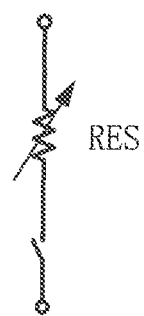
FIG. 6 is an equivalent circuit diagram of a self-heating compensation circuit in FIG. 3.

It can be learned according to a temperature characteristic of a heterojunction bipolar transistor that a rise in a junction temperature of a transistor inside a chip causes a drop in power gains of the transistor. Especially in a high power working state, an increase in a voltage VCE between a collector and an emitter further reduces the gains. Specifically, a mobile phone becomes hot, an output power reduces, signal quality deteriorates, and so on. Referring to FIG. 6, the self-heating compensation circuit 50 may be equivalent to a variable resistor that makes the base of the power-amplifier tube Q1 grounded, and a switch in the path is controlled by the voltage VCE of the power tube Q1. A value of the variable resistor controls a compensated current value, and the switch controls on or off of the compensation path. When an input signal is relatively small, gains of the power tube Q1 decline inconspicuously, the switch is off, and no compensated current is generated. As the input signal increases, the switch of the compensation path is conducted, to generate a compensated current IB1. Because the power-amplifier tube Q works at a constant current, to keep the entire current IB unchanged, the voltage VCE between the collector and the emitter of the power-amplifier tube Q1 rises, VBE between the base and the emitter reduces, the compensated current IB1 reduces, and a current IB-IB1 entering the power tube Q1 increases. Although the rise in the junction temperature causes the drop in the gains of the power tube, the self-heating compensation circuit 50 in the present invention generates a compensated current to prevent a current of the collector of the power tube from a reduction, so that the power-amplifier tube shows constant power gains as a whole.

It should be noted that, the foregoing mainly describes composition of the bias circuit of the first-stage power-amplifier tube Q1. Working states, including working temperatures, emitter areas, bias classes (a class A, a class AB, or a class B), of the second-stage power-amplifier tube Q2 and the first-stage power-amplifier tube Q1 are not completely the same. Therefore, when a power amplifier includes a multistage power-amplifier tube, principle diagrams of a bias voltage circuit and a self-heating compensation circuit at each stage are the same as those of the first-stage power-amplifier tube. Specifically, a quantity of diodes connected in parallel, and a value of a compensated resistor may be different, and need to be determined according to a specific design requirement of the power amplifier.

The present invention further discloses a mobile terminal. A power amplifier of the mobile terminal uses the foregoing active bias circuit. A communications terminal mentioned herein may be a computer device that may be used in a moving environment and support multiple communications standards such as Wi-Fi, GSM, EDGE, TD_SCDMA, TDD_LTE, and FDD_LTE, and includes, but is not limited to a 3G/4G mobile phone, a notebook computer, a tablet computer, and a vehicle-mounted computer. In addition, the active bias circuit is also applicable to another scenario in which a power amplifier is applied, for example, a communications base station compatible with multiple communications standards.

In conclusion, in the active bias circuit provided in the present invention, the PTAT current source circuit and the reference voltage circuit may generate a current and a voltage that are in proportion to a temperature. The isolation voltage stabilizing circuit ensures stabilized output of the bias circuit by using a negative feedback loop, to suppress to some extent bias state shifting caused by temperature shifting, to provide a stabilized bias state for a chip. In addition, the bias voltage circuit and the self-heating compensation circuit overcome, by using a compensation principle, linearity deterioration caused by an increase in a temperature in a high power output state, thereby effectively improving linearity of a power amplifier.

The foregoing describes in detail the active bias circuit for a power amplifier and the mobile terminal that are provided in the present invention. Any obvious modification made by a person of ordinary skill in the art without departing from the essence and spirit of the present invention shall fall within the protection scope of the present invention.

What is claimed is:

1. An active bias circuit for a power amplifier, comprising a proportional to absolute temperature (PTAT) current source circuit, a reference voltage circuit, an isolation voltage stabilizing circuit, and a bias voltage circuit, wherein
   an input end of the PTAT current source circuit is connected to a voltage source, and an output end is connected to the reference voltage circuit, to generate a current that is in proportion to the voltage source and a temperature;
   the reference voltage circuit generates a reference voltage that is in proportion to the current and the temperature;
   the isolation voltage stabilizing circuit isolates the reference voltage circuit from the bias voltage circuit, and supplies a stabilized voltage to the bias voltage circuit by using a negative feedback loop; and
   the bias voltage circuit receives the voltage of the isolation voltage stabilizing circuit, and is also connected to the voltage source, to generate a bias voltage of a power-amplifier tube;
   the PTAT current source circuit comprises two groups of current minor circuits, multiple triodes, and a resistor, wherein
   a first group of current minor circuit comprises three P-type metal-oxide-semiconductor (PMOS) transistors; sources of the PMOS transistors are connected to the voltage source, and gates of the PMOS transistors interconnect with each other; a drain of a first PMOS transistor is connected to a drain of a first N-type metal-oxide-semiconductor (NMOS) transistor; a drain of a second PMOS transistor is connected to a drain of a second NMOS transistor, and a drain of a third PMOS transistor is connected to the reference voltage circuit;
   a second group of current minor circuit comprises the first NMOS transistor and the second NMOS transistor, a gate of the first NMOS transistor is connected to the drain of the first NMOS transistor and a gate of the second NMOS transistor, and a source is connected to a first triode; and a source of the second NMOS transistor is connected to a first resistor;
   the first triode and a second triode are serially connected to the ground; and
   the first resistor, a third triode, and a fourth triode are serially connected to the ground.

2. The active bias circuit according to claim 1, wherein emission junction areas of the first triode and the second triode are equal, emission junction areas of the third triode and the fourth triode are equal, and an emission junction area of the first triode needs to be greater than an emission junction area of the third triode.

3. The active bias circuit according to claim 1, wherein the reference voltage circuit comprises triodes and one resistor, wherein
   one end of a second resistor is separately connected to the PTAT current source circuit and the isolation voltage stabilizing circuit; and
   the other end of the second resistor is connected to a collector and a base of a fifth triode; an emitter of the fifth triode is connected to a collector and a base of a sixth triode; and an emitter of the sixth triode is grounded.

4. The active bias circuit according to claim 1, wherein the isolation voltage stabilizing circuit comprises multiple resistors and triodes, wherein
   a collector of a seventh triode is connected to an output end of the reference voltage circuit and one end of a third resistor, a base is connected to the other end of the third resistor and a collector of an eighth triode, and an emitter is connected to a fourth resistor and a base of the eighth triode;
   an emitter of the eighth triode and the other end of the fourth resistor are both grounded; and
   a point that connects the seventh triode, the third resistor, and the eighth triode is connected to the bias voltage circuit.

5. The active bias circuit according to claim 4, wherein the emitter of the eighth triode is grounded by using a resistor.

6. The active bias circuit according to claim 1, wherein the bias voltage circuit is a triode, wherein
   a collector of a ninth triode is connected to the voltage source, a base receives the voltage supplied by the isolation voltage stabilizing circuit, and an emitter is connected to a base of the power-amplifier tube.

7. The active bias circuit according to claim 6, wherein the bias voltage circuit further comprises multiple diodes that are connected in parallel, wherein
   an anode of each diode is grounded, and a cathode is connected to the collector of the ninth triode.

8. The active bias circuit according to claim 1, wherein the active bias circuit further comprises a self-heating compensation circuit; and
   the self-heating compensation circuit comprises a triode and a resistor; a base of a tenth triode is connected to a base of the power-amplifier tube, a collector is grounded by using a fifth resistor, and an emitter is connected to a collector of the power-amplifier tube.

9. A mobile terminal, wherein a power amplifier of the mobile terminal uses the active bias circuit according to claim 1.

\* \* \* \* \*